United States Patent
Cheng et al.

(10) Patent No.: US 10,417,972 B1
(45) Date of Patent: Sep. 17, 2019

(54) GAMMA CORRECTION DIGITAL-TO-ANALOG CONVERTER, DATA DRIVER AND METHOD THEREOF

(71) Applicant: Novatek Microelectronics Corp., Hsinchu (TW)

(72) Inventors: Jhih-Siou Cheng, New Taipei (TW); Ju-Lin Huang, Hsinchu County (TW)

(73) Assignee: Novatek Microelectronics Corp., Hsinchu (TW)

(*) Notice: Subject to any disclaimer, the term of this patent is extended or adjusted under 35 U.S.C. 154(b) by 0 days.

(21) Appl. No.: 16/219,866

(22) Filed: Dec. 13, 2018

(51) Int. Cl.
*H03M 1/66* (2006.01)
*G09G 3/3291* (2016.01)
*G09G 3/3233* (2016.01)
*H03M 1/74* (2006.01)

(52) U.S. Cl.
CPC ......... *G09G 3/3291* (2013.01); *G09G 3/3233* (2013.01); *G09G 2310/0202* (2013.01); *G09G 2310/027* (2013.01); *G09G 2320/0276* (2013.01); *G09G 2330/028* (2013.01); *H03M 1/66* (2013.01); *H03M 1/747* (2013.01)

(58) Field of Classification Search
CPC ............... H03M 1/66; H03M 1/747; G09G 2310/0202; G09G 3/3233
USPC ....... 341/144, 145; 345/210, 77, 99, 100, 89
See application file for complete search history.

(56) References Cited

U.S. PATENT DOCUMENTS

2009/0066681 A1* 3/2009 Kim .................. G09G 3/2007
345/210

* cited by examiner

Primary Examiner — Joseph J Lauture
(74) Attorney, Agent, or Firm — JCIPRNET

(57) ABSTRACT

A gamma correction digital-to-analog converter (DAC) includes a first DAC circuit, a second DAC circuit and a voltage generator. The first DAC circuit includes a plurality of first transistors and is configured to receive a plurality of first reference gamma voltages and 1 upper bits of k-bit digital data and generate a first gamma voltage based on the 1 upper bits of the k-bit digital data and the first reference gamma voltages. The second DAC circuit includes a plurality of second transistors and is configured to receive a plurality of second reference gamma voltages and m lower bits of the k-bit digital data and generate a second gamma voltage based on the m lower bits of the k-bit digital data and the second reference gamma voltages. The voltage generator is configured to generate a bulk voltage and supply the generated bulk voltage to a bulk terminal of each of the first transistors or supply the generated bulk voltage to a bulk terminal of each of the second transistors to generate a gamma correction analog signal according to the first gamma voltage and the second gamma voltage. A data driver including a gamma correction DAC and a method thereof are also introduced.

19 Claims, 5 Drawing Sheets

GAMMA CORRECTION DIGITAL-TO-ANALOG CONVERTER, DATA DRIVER AND METHOD THEREOF

BACKGROUND OF THE INVENTION

1. Field of the Invention

The disclosure generally relates to a digital-to-analog converter (DAC), and more particularly related to a gamma correction DAC, a data driver and a method thereof that are capable of improving the output dynamic range of the gamma correction DAC.

2. Description of Related Art

DAC is an electronic device for converting a digital data to an analog signal, and is an essential electronic component in a display system such as an organic light-emitting diode (OLED) display system. Gamma correction operation is performed by the DAC so as to accurately display the data on a display panel of the display system.

Along with the popularity of the OLED display technology, it would be desirable to have a gamma correction DAC that occupies small area, is capable of adjusting the output dynamic range, and has a small internal resistance.

Nothing herein should be construed as an admission of knowledge in the prior art of any portion of the present disclosure.

SUMMARY OF THE INVENTION

A gamma correction digital-to-analog converter (DAC), a data driver and a method that are capable of dynamically adjusting output dynamic range, having small occupied area and having small internal resistance are introduced.

The gamma correction DAC includes a first DAC circuit, a second DAC circuit and a voltage generator. The first DAC circuit includes a plurality of first transistors and is configured to receive a plurality of first reference gamma voltages and l upper bits of k-bit digital data and generate a first gamma voltage based on the l upper bits of the k-bit digital data and the first reference gamma voltages. The second DAC circuit includes a plurality of second transistors and is configured to receive a plurality of second reference gamma voltages and m lower bits of the k-bit digital data and generate a second gamma voltage based on the m lower bits of the k-bit digital data and the second reference gamma voltages, where l, m and k are natural numbers, and l and m are smaller than k. The voltage generator is configured to generate a bulk voltage and supply the generated bulk voltage to a bulk terminal of each of the first transistors or supply the generated bulk voltage to a bulk terminal of each of the second transistors to generate a gamma correction analog signal according to the first gamma voltage and the second gamma voltage.

The data driver includes gamma correction DAC that includes a first DAC circuit, a second DAC circuit and a voltage generator.

The method for converting k-bit digital data to a gamma correction analog signal, adapted to a gamma correction digital-to-analog converter. The method includes steps of receiving a plurality of first reference gamma voltages and l upper bits of the k-bit digital data and generating a first gamma voltage based on the l upper bits of the k-bit digital data and the first reference gamma voltages, where k is a natural number; receiving a plurality of second reference gamma voltages and m lower bits of the k-bit digital data and generating a second gamma voltage based on the m lower bits of the k-bit digital data and the second reference gamma voltages; generating a bulk voltage and supplying the generated bulk voltage to a bulk terminal of each of first transistors or supplying the generated bulk voltage to a bulk terminal of each of second transistors to generate the gamma correction analog signal according to the first gamma voltage and the second gamma voltage.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

It is to be understood that other embodiments may be utilized and structural changes may be made without departing from the scope of the present disclosure. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
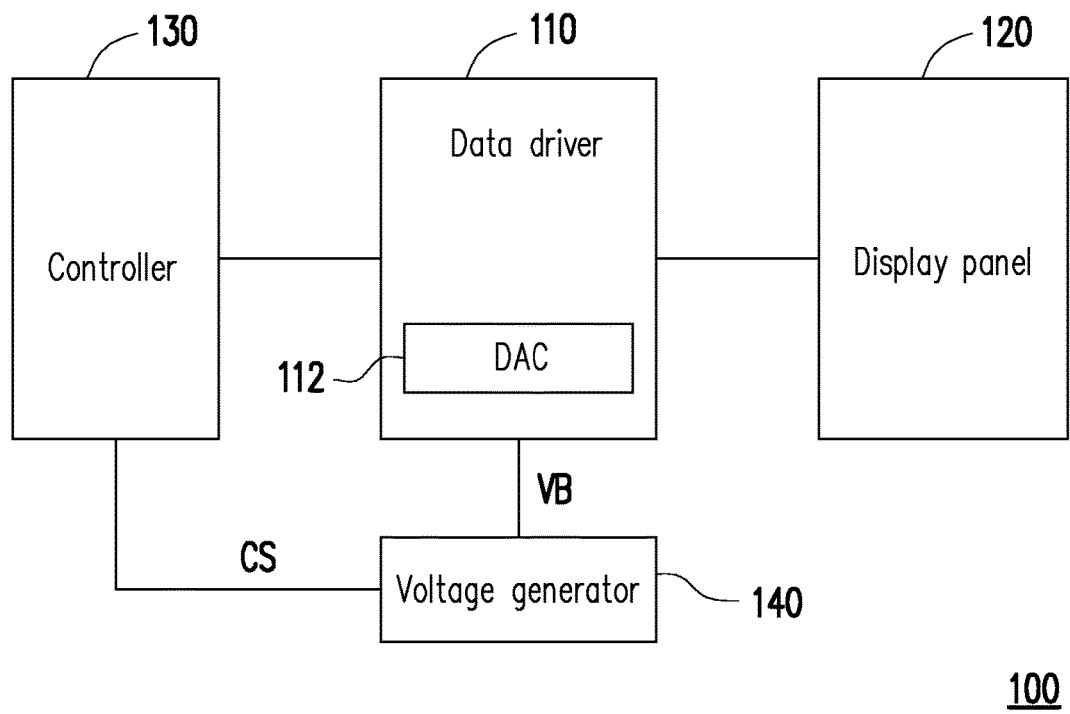
FIG. 1 illustrates a display system that includes a data driver with a gamma correction DAC according to an embodiment of the disclosure.

Referring to FIG. 1, a display system 100 includes a data driver 110, a display panel 120, a controller 130 and a voltage generator 140. The data driver 110 includes a gamma correction DAC 112 which is configured to generate the gamma corrected display signals for the display panel 120. The display panel 120 is configured to display data according to the gamma corrected display signals output from the data driver 110. The voltage generator 140 is configured to generate different voltages for an operation of the display system 100. The voltage generator 140 may generate a bulk voltage VB which is supplied to the transistors located in the gamma correction DAC 112. The controller 130 is configured to control operations of components in the display system 100. In an embodiment of the disclosure, the bulk voltage VB is generated according to a control signal CS output by the controller 120. The value of the bulk voltage may be adjusted according to the control signal CS.

In an embodiment of the disclosure, the display panel 120 may be an organic light-emitting diode (OLED) display panel, and the data driver 110 may be the OLED data driver for driving the OLED display panel.

Figure 2:
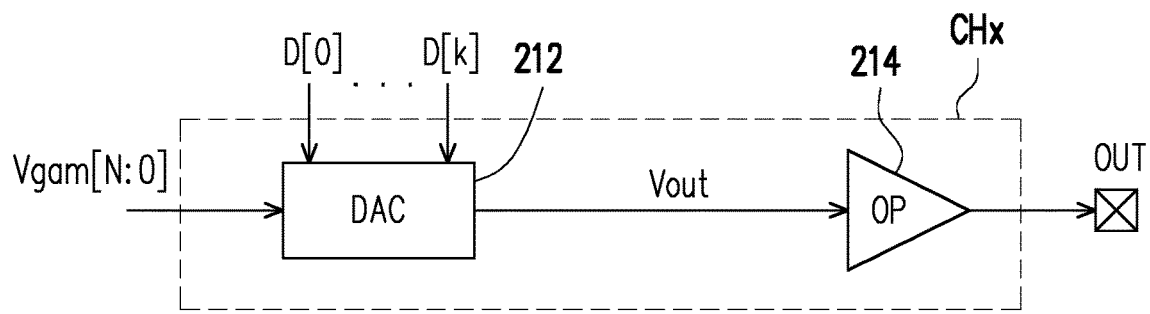
FIG. 2 illustrates a data channel of a data driver according to an embodiment of the disclosure.

Referring to FIG. 2, a channel CHx of a data driver 210 includes a gamma correction correction DAC 212 and an output buffer amplifier 214. In the channel CHx, the gamma correction DAC 212 receives reference gamma voltages Vgam [N:0] and k-bit digital data D[0] to D[k], where N and k are natural numbers. The gamma correction DAC is configured to generate an output voltage Vout based on the received reference gamma voltages Vgam[N:0] and the k-bit digital data D[0] to D[k]. The output buffer amplifier 212 receives output voltage Vout and output an amplified output voltage to the terminal OUT of the channel CHx.

Figure 3A:
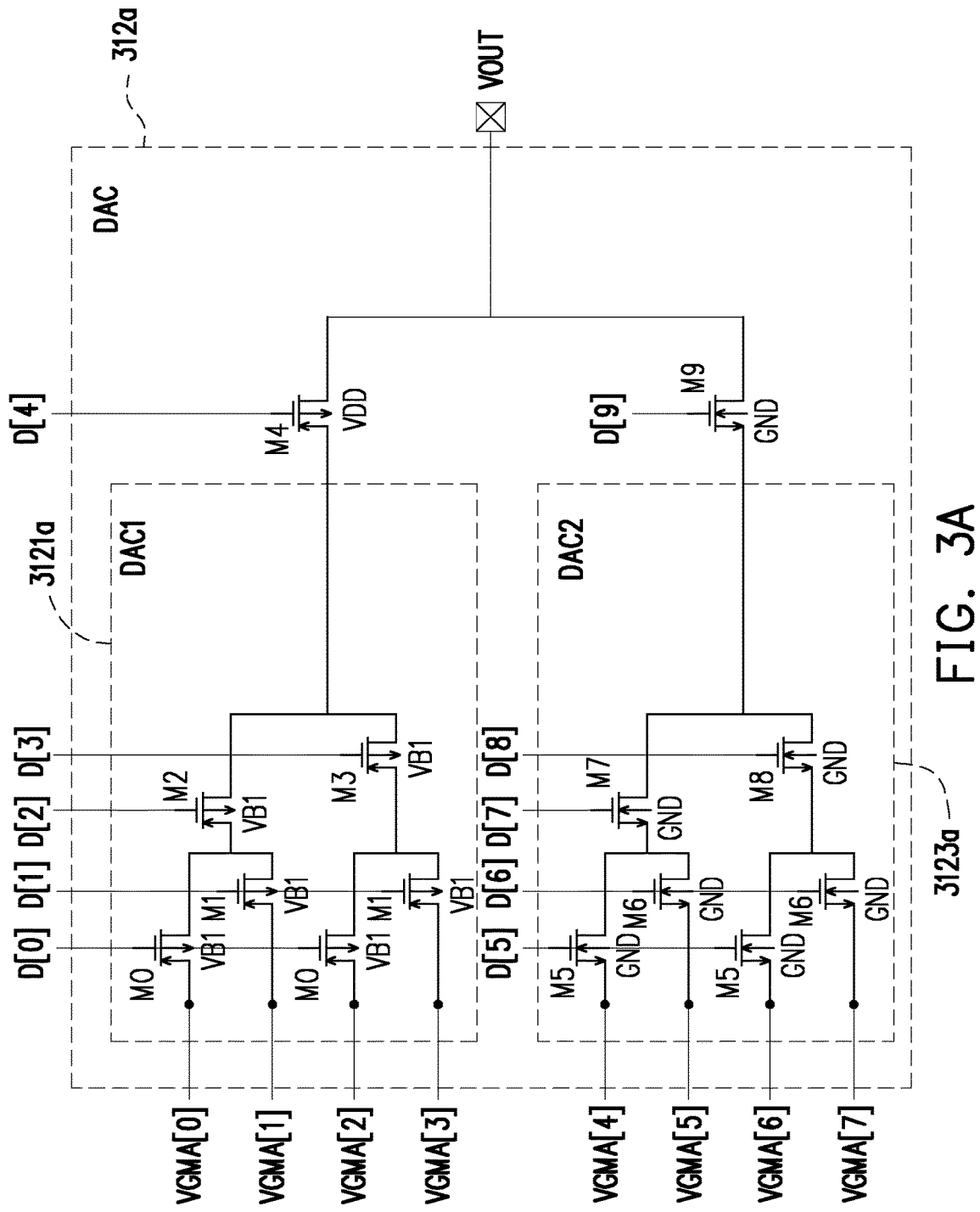
FIG. 3A to FIG. 3B illustrate gamma correction DACs according to embodiments of the disclosure.

Referring to FIG. 3A, an example of 10-bit gamma correction DAC 312a is illustrated. The gamma correction DAC 312a includes a first DAC circuit 3121a and a second DAC circuit 3123a. The first DAC circuit 3121a receives reference gamma voltages VGMA[0] to VGMA[3] and lower bits D[0] to D[3] of the digital data, and is configured to output a first gamma voltage according to the received reference gamma voltages VGMA[0] to VGMA[3] and the received lower bits D[0] to D[3] of the digital data. The first DAC circuit 3121a includes a plurality of transistors M0 to M3, where the gate terminal of each of the transistors M0 to M3 receives one of the bits D[0] to D[3], and the drain terminal of each of the transistors M0 to M3 receives one of the reference gamma voltages VGAM[0] to VGAM[3]. The bulk terminal of each of the transistors M0 to M3 receives a bulk voltage VB1 which is generated by a voltage generator such as the voltage generator 140 shown in FIG. 1.

The value of the bulk voltage VB1 is adjustable according to the control signal CS. In an embodiment of the disclosure, the value of the bulk voltage VB1 is in a range from a max reference gamma voltage to the power supply voltage VDD, wherein the max reference gamma voltage is the maximum voltage value among the reference gamma voltages. It should be noted that the values of the reference gamma voltages are in the range from the ground voltage GND to the power supply voltage VDD, thus the max reference gamma voltage is smaller than the power supply voltage VDD. Since the bulk voltage VB1 is adjustable instead of being fixed at the power supply voltage VDD, the body effect of the transistors M0 to M3 may be controlled, and the output dynamic range of the gamma correction DAC 312a is improved. In addition, when the bulk voltage VB1 is adjustable in the range from the max reference gamma voltage to the power supply voltage VDD, the drain-bulk voltage VDB of the transistor M0 to M3 may be smaller, the internal resistance Ron is small. As a result, the output dynamic range is improved, the internal resistance Ron is reduced, and the performance of the gamma correction DAC 312a is improved.

The second DAC circuit 3123a receives reference gamma voltages VGMA[4] to VGMA[7] and upper bits D[4] to D[7] of the digital data, i.e. l upper bits of the k-bit digital data, and is configured to output a second gamma voltage according to the received reference gamma voltages VGMA[4] to VGMA[7] and the received lower bits D[5] to D[8] of the digital data, i.e. m upper bits of the k-bit digital data, where l, m and k are natural numbers, and l and m are smaller than k. The second DAC circuit 3123a includes a plurality of transistors M5 to M8, where the gate terminal of each of the transistors M5 to M8 receives one of the bits D[5] to D[8], and the drain terminal of each of the transistors M5 to M8 receives one of the reference gamma voltages VGAM[4] to VGAM[7]. The bulk terminal of each of the transistors M5 to M8 receives the ground voltage GND.

The gamma correction DAC 312a further includes transistors M4 and M9. The gate terminal of the transistor M4 receives the bit D[4] of the digital data, and the bulk terminal of the transistor M4 receives the power supply voltage VDD. The gate terminal of the transistor M9 receives the bit D[9] of the digital data, and the bulk terminal of the transistor M8 receives the ground voltage GND. The transistor M4 is configured to select or deselect the first gamma voltage generated by the first DAC 3121a according to the value of the bit D[4]. The transistor M9 is configured to select or deselect the second gamma voltage generated by the second DAC 3123a according to the value of the bit D[9].

In an embodiment of the disclosure, the transistors M0 to M3 and M5 to M8 are medium voltage transistors, and the transistors M4 and M9 are high voltage transistors. In other words, the threshold values of the transistors M4 and M9 is higher than the threshold values of the transistors M0 to M3 and M5 to M8. Since the high voltage transistors has larger occupied area than the medium voltage transistor, the occupied areas of the transistors M0 to M3 and M5 to M8 is small in a circuit board. In this way, the overall occupied area of the gamma correction DAC 312a is reduced.

Figure 3B:
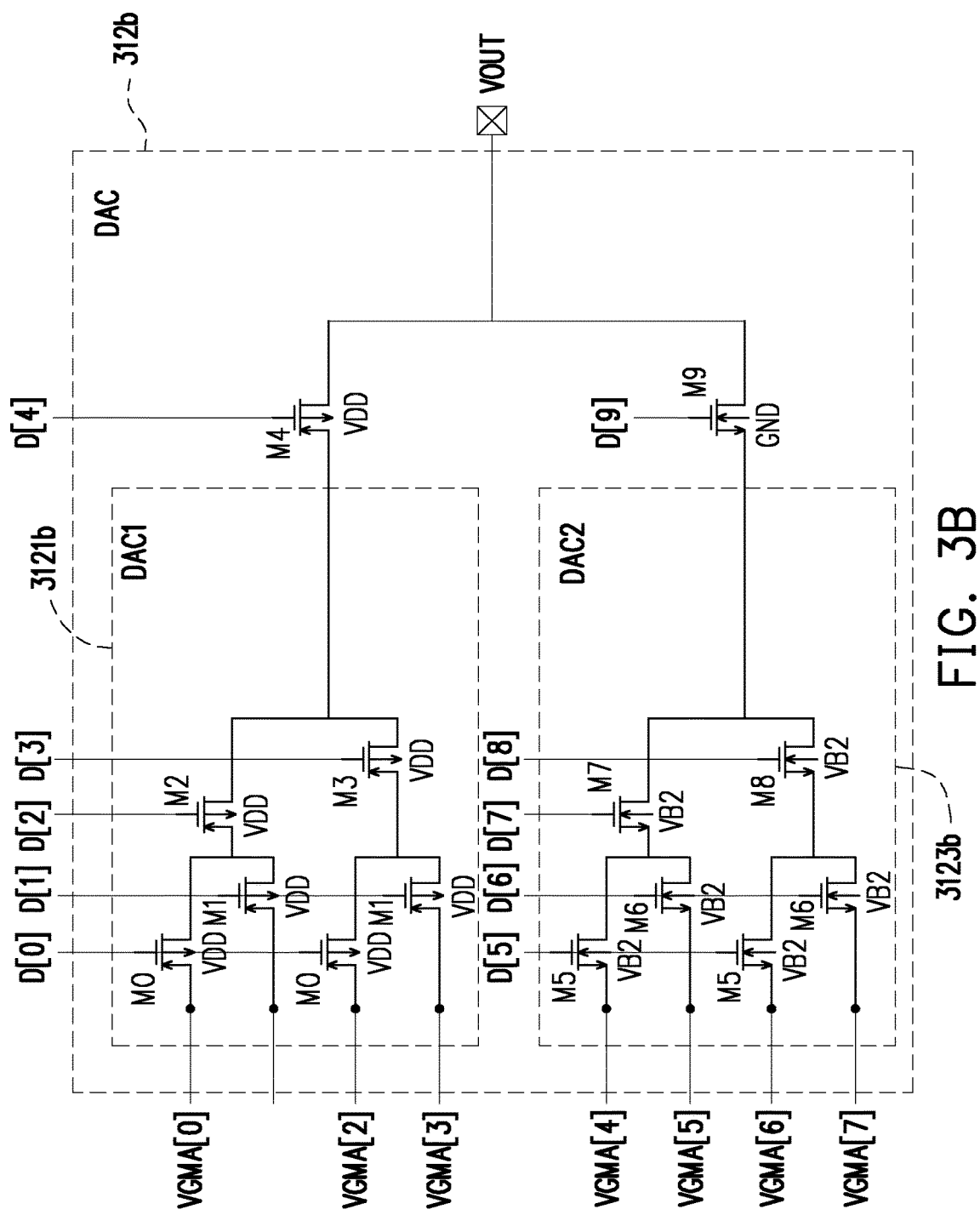

Referring to FIG. 3B, an example of 10-bit gamma correction DAC 312b is illustrated. The gamma correction DAC 312b includes a first DAC circuit 3121b and a second DAC circuit 3123b. A difference between the gamma correction DAC 312b shown in FIG. 3B and the gamma correction DAC 312a shown in FIG. 3A is that bulk voltages being supplied to the bulk terminals of the transistors M0 to M3 and M5 to M8. Particularly, in FIG. 3B, the bulk terminal of each of the transistors M0 to M3 of the first DAC circuit 3121b receives the power supply voltage VDD, and each of the transistors M5 to M8 of the second DAC circuit 3123b receives the bulk voltage VB2 which is generated by the voltage generator. In FIG. 3A, the bulk terminal of each of the transistors M0 to M3 of the first DAC circuit 3121a receives the bulk voltage VB1, and each of the transistors M5 to M8 of the second DAC circuit 3123a receives the ground voltage GND.

The value of the bulk voltage VB2 is adjustable according to the control signal CS. In an embodiment of the disclosure, the value of the bulk voltage VB2 is in a range from a ground voltage GND to a min reference gamma voltage, wherein the min reference gamma voltage is the minimum voltage value among the reference gamma voltages. Since the bulk voltage VB2 is adjustable instead of being fixed at the ground voltage GND, the body effect of the transistors M5 to M8 may be controlled, and the output dynamic range of the gamma correction DAC 312b is improved. In addition, when the bulk voltage VB2 is adjustable in the range from the ground voltage GND to the min reference gamma voltage, the internal resistance Ron is small, and the performance of the gamma correction DAC 312b is further improved.

In FIG. 3A and FIG. 3B, there are four upper bits D[0] to D[3] of the digital data are input to the first DAC circuit 3121a/3121b and four lower bit D[5] to D[8] are input to the second DAC circuit 3123a/3123b, but the disclosure is not limited to any specific number of lower bits, upper bits or the bit number of the digital data.

Figure 4A:
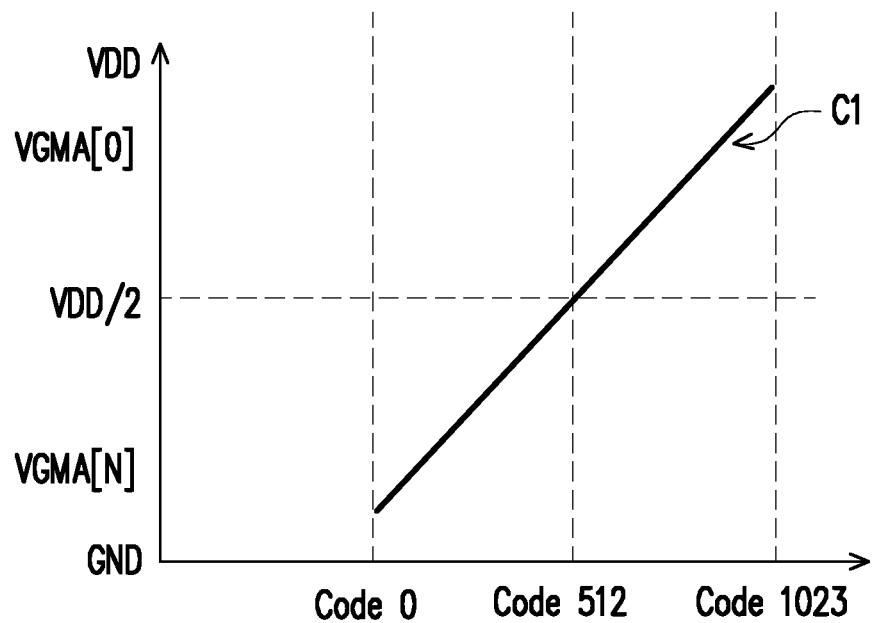
FIG. 4A to FIG. 4B illustrate gamma correction curves in a driving phase and a sensing phase of a gamma correction DAC according to an embodiment of the disclosure.

Referring to FIG. 4A, an example of a gamma corrections curve C1 during a driving phase of the OLED display system is illustrated. The gamma correction curve C1 indicates the relationship between the code (e.g., grayscale value) of the digital data and a number of reference gamma correction voltages VGMA[0] to VGMA[N], where reference gamma correction voltages VGMA[0] to VGMA[N] are arranged from the ground voltage GND to the power supply voltage VDD. The gamma correction DAC of the OLED display system uses the gamma correction curve C1 during the driving phase of the OLED display panel so as to perform a gamma correction operation.

Figure 4B:
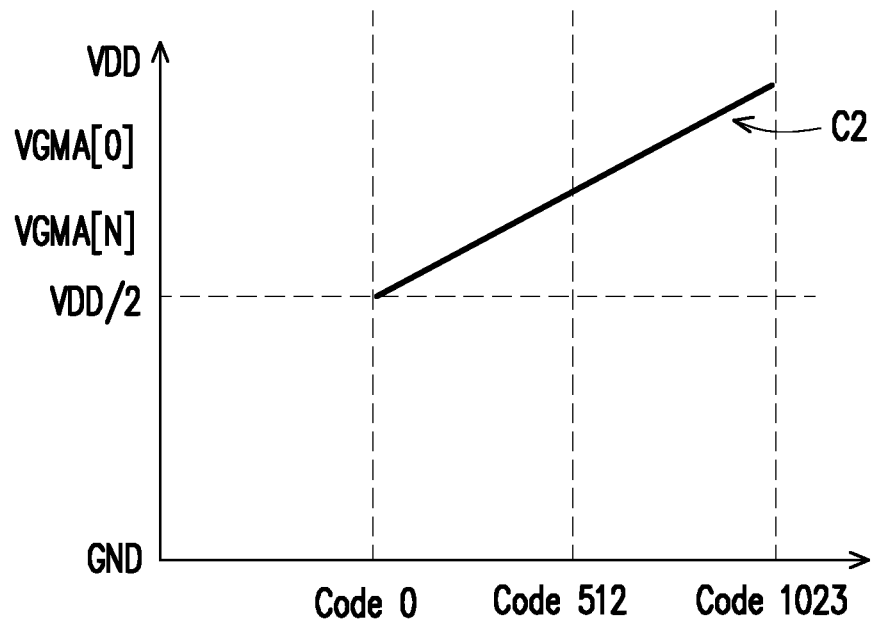

Referring to FIG. 4B, an example of a gamma corrections curve C2 during a sensing phase of the OLED display system is illustrated. The gamma correction curve C2 indicates the relationship between the code (e.g., grayscale value) of the digital data and a number of reference gamma correction voltages VGMA[0] to VGMA[N], where reference gamma correction voltages VGMA[0] to VGMA[N] are arranged from the a half of the power supply voltage (VDD/2) to the power supply voltage VDD. The gamma correction DAC of the OLED display system uses the gamma correction curve C2 during the sensing phase of the OLED display panel so as to perform a gamma correction operation.

As the examples shown in FIG. 4A and FIG. 4B, the digital data is 10-bit digital data, thus there are 1023 ($2^{10}$) codes or grayscale values. However, the digital data with other bit number falls within the scope of the disclosure.

Figure 5:
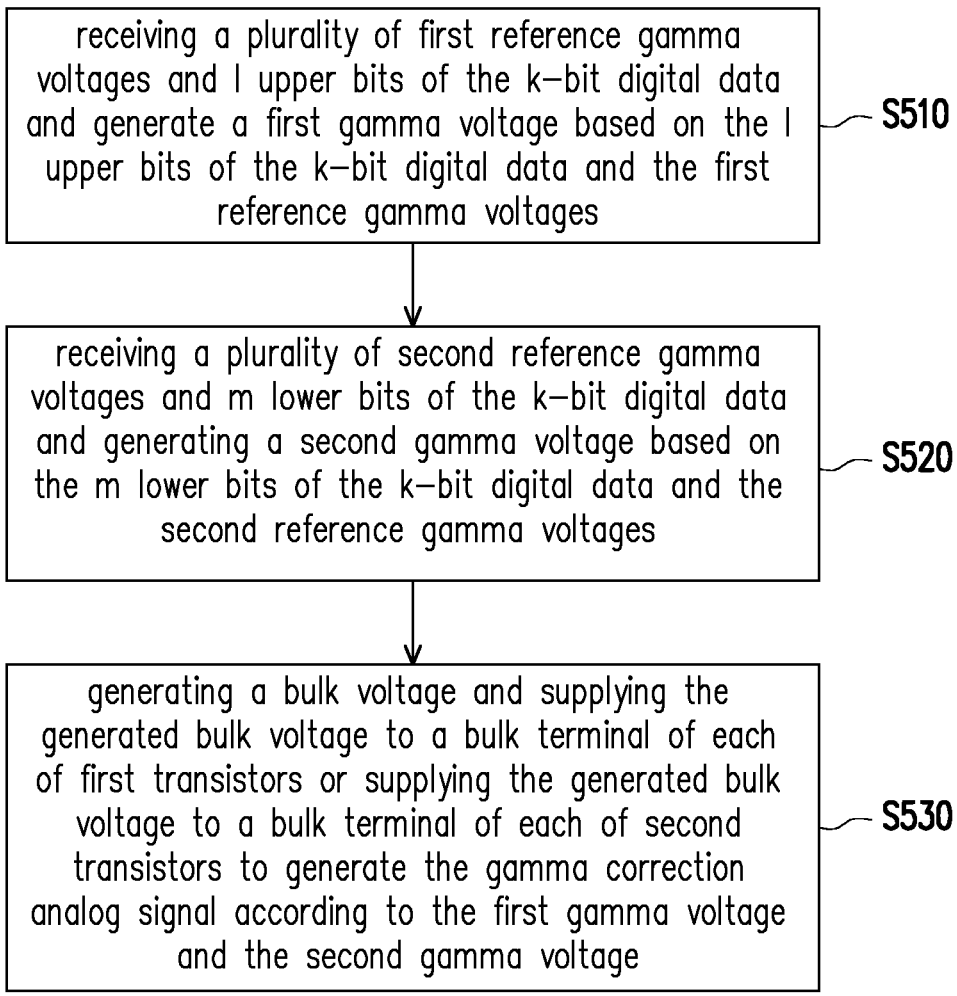
FIG. 5 illustrates a method for converting k-bit digital data to a gamma correction analog signal according to an embodiment of the disclosure.

Referring to FIG. 5, a method for converting k-bit digital data to a gamma correction analog signal according to an embodiment of the disclosure is illustrated. In step S510, a plurality of first reference gamma voltages and l upper bits of the k-bit digital data are received; and a first gamma voltage is generated based on the l upper bits of the k-bit digital data and the first reference gamma voltages, where k is a natural number. In step S520, a plurality of second reference gamma voltages and m lower bits of the k-bit digital data are received; and a second gamma voltage is generated based on the m lower bits of the k-bit digital data and the second reference gamma voltages, where l, m and k are natural numbers, and l and m are smaller than k. In step S530, a bulk voltage is generated and the generated bulk voltage is supplied to a bulk terminal of each of first transistors or to a bulk terminal of each of second transistors to generate the gamma correction analog signal according to the first gamma voltage and the second gamma voltage.

From the above embodiments, the bulk voltage supplied to the transistors of the gamma correction DAC may be dynamically adjustable in a specific range instead of being fixed. If the adjustable bulk voltage is supplied to first DAC circuit of the gamma correction DAC, then the adjustable bulk voltage is in the range from the max reference gamma voltages to the power supply voltage VDD. If the adjustable bulk voltage is supplied to second DAC circuit of the gamma correction DAC, then the adjustable bulk voltage is in the range from the ground voltage VDD to the min reference gamma voltages. In this way, the influence of the transistor body to the operation of the gamma correction DAC is reduced, and the output dynamic range of the gamma correction DAC is improved. Furthermore, the transistors of the first and second DAC circuits are medium voltage transistors which has small occupied area, the overall occupied area of the DAC is reduced.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A gamma correction digital-to-analog converter (DAC), comprising:
   a first DAC circuit, comprising a plurality of first transistors, configured to receive a plurality of first reference gamma voltages and l upper bits of k-bit digital data and generate a first gamma voltage based on the l upper bits of the k-bit digital data and the first reference gamma voltages;
   a second DAC circuit, comprising a plurality of second transistors, configured to receive a plurality of second reference gamma voltages and m lower bits of the k-bit digital data and generate a second gamma voltage based on the m lower bits of the k-bit digital data and the second reference gamma voltages, where l, m and k are natural numbers, and l and m are smaller than k; and
   a voltage generator, configured to generate a bulk voltage and supply the generated bulk voltage to a bulk terminal of each of the first transistors or supply the generated bulk voltage to a bulk terminal of each of the second transistors to generate a gamma correction analog signal according to the first gamma voltage and the second gamma voltage.

2. The gamma correction DAC of claim 1, further comprising:
   a third transistor, coupled to the first DAC circuit, configured to select the first gamma voltage according to a bit of the k-bit digital data; and
   a fourth transistor, coupled to the second DAC circuit, configured to select the second gamma voltage according to a bit of the k-bit digital data,
   wherein a bulk terminal of the third transistor receives a power supply voltage, and a bulk terminal of the fourth transistor receives a ground voltage.

3. The gamma correction DAC of claim 2, wherein threshold values of the first transistors and the second transistors are smaller than threshold values of the third transistors and the fourth transistors.

4. The gamma correction DAC of claim 1, wherein
   the first reference gamma voltages and the second reference gamma voltages include a max reference gamma voltage and a min reference gamma voltage,
   the max reference gamma voltage is the greatest reference gamma voltage among the first reference gamma voltages and the second reference gamma voltages, and
   the min reference gamma voltage is the smallest reference gamma voltage among the first reference gamma voltages and the second reference gamma voltages.

5. The gamma correction DAC of claim 4, wherein when the bulk terminals of the first transistors receive the bulk voltage, the bulk voltage is in a range from the max reference gamma voltage to the power supply voltage, and the bulk terminals of the second transistors receive the ground voltage.

6. The gamma correction DAC of claim 4, wherein when the bulk terminals of the second transistors receive the bulk voltage, the bulk voltage is in a range from the ground voltage to the min reference gamma voltage, and the bulk terminals of the first transistors receive the power supply voltage.

7. The gamma correction DAC of claim 1, wherein the bulk voltage is generated according to a control signal, and a value of the bulk voltage is dynamically adjustable according to the control signal.

8. A data driver, comprising:
   a gamma correction digital-to-analog converter (DAC), comprising:
      a first DAC circuit, comprising a plurality of first transistors, configured to receive a plurality of first reference gamma voltages and l upper bits of k-bit digital data and generate a first gamma voltage based on the 1 upper bits of the k-bit digital data and the first reference gamma voltages, where k is a natural number;

a second DAC circuit, comprising a plurality of second transistors, configured to receive a plurality of second reference gamma voltages and m lower bits of the k-bit digital data and generate a second gamma voltage based on the m lower bits of the k-bit digital data and the second reference gamma voltages, where l, m and k are natural numbers, and l and m are smaller than k; and a voltage generator, configured to generate a bulk voltage and supply the generated bulk voltage to a bulk terminal of each of the first transistors or supply the generated bulk voltage to a bulk terminal of each of the second transistors to generate a gamma correction analog signal according to the first selected gamma voltage and the second selected gamma voltage.

9. The data driver of claim 8, wherein the DAC further comprising:

a third transistor, coupled to the first DAC circuit, configured to select the first gamma voltage according to a bit of the k-bit digital data; and a fourth transistor, coupled to the second DAC circuit, configured to select the second gamma voltage according to a bit of the k-bit digital data, wherein a bulk terminal of the third transistor receives a power supply voltage, and a bulk terminal of the fourth transistor receives a ground voltage.

10. The data driver of claim 9, wherein threshold values of the first transistors and the second transistors are smaller than threshold values of the third transistors and the fourth transistors.

11. The data driver of claim 8, wherein the first reference gamma voltages and the second reference gamma voltages include a max reference gamma voltage and a min reference gamma voltage, the max reference gamma voltage is the greatest reference gamma voltage among the first reference gamma voltages and the second reference gamma voltages, and the min reference gamma voltage is the smallest reference gamma voltage among the first reference gamma voltages and the second reference gamma voltages.

12. The data driver of claim 11, wherein when the bulk terminals of the first transistors receive the bulk voltage, the bulk voltage is in a range from the max reference gamma voltage to the power supply voltage, and the bulk terminals of the second transistors receive the ground voltage.

13. The data driver of claim 11, wherein when the bulk terminals of the second transistors receive the bulk voltage, the bulk voltage is in a range from the ground voltage to the min reference gamma voltage, and the bulk terminals of the first transistors receive the power supply voltage.

14. The data driver of claim 8, wherein the bulk voltage is generated according to a control signal, and a value of the bulk voltage is dynamically adjustable according to the control signal.

15. A method for converting k-bit digital data to a gamma correction analog signal, adapted to a gamma correction digital-to-analog converter, comprising:

receiving a plurality of first reference gamma voltages and 1 upper bits of the k-bit digital data and generating a first gamma voltage based on the 1 upper bits of the k-bit digital data and the first reference gamma voltages, where k is a natural number;

receiving a plurality of second reference gamma voltages and m lower bits of the k-bit digital data and generating a second gamma voltage based on the m lower bits of the k-bit digital data and the second reference gamma voltages, where l, m and k are natural numbers, and l and m are smaller than k;

generating a bulk voltage and supplying the generated bulk voltage to a bulk terminal of each of first transistors or supplying the generated bulk voltage to a bulk terminal of each of second transistors to generate the gamma correction analog signal according to the first gamma voltage and the second gamma voltage.

16. The method of claim 15, wherein the first reference gamma voltages and the second reference gamma voltages include a max reference gamma voltage and a min reference gamma voltage, the max reference gamma voltage is the greatest reference gamma voltage among the first reference gamma voltages and the second reference gamma voltages, and the min reference gamma voltage is the smallest reference gamma voltage among the first reference gamma voltages and the second reference gamma voltages.

17. The method of claim 16, wherein when the bulk terminals of the first transistors receive the bulk voltage, the bulk voltage is in a range from the max reference gamma voltage to the power supply voltage, and the bulk terminals of the second transistors receive the ground voltage.

18. The method of claim 16, wherein when the bulk terminals of the second transistors receive the bulk voltage, the bulk voltage is in a range from the ground voltage to the min reference gamma voltage, and the bulk terminals of the first transistors receive the power supply voltage.

19. The method of claim 15, wherein the bulk voltage is generated according to a control signal, and a value of the bulk voltage is dynamically adjustable according to the control signal.

* * * * *